United States Patent
Kim et al.

(10) Patent No.: US 11,892,327 B2
(45) Date of Patent: Feb. 6, 2024

(54) READ-OUT CIRCUIT FOR A CAPACITIVE SENSOR

(71) Applicant: Seoul National University R&DB Foundation, Seoul (KR)

(72) Inventors: Minsung Kim, Gwacheon-si Gyeonggi-do (KR); Hyunjoong Lee, Daejeon (KR); Suhwan Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 129 days.

(21) Appl. No.: 17/828,269

(22) Filed: May 31, 2022

(65) Prior Publication Data

US 2022/0390259 A1 Dec. 8, 2022

(30) Foreign Application Priority Data

Jun. 3, 2021 (KR) .......... 10-2021-0072317

(51) Int. Cl.
*G01D 5/24* (2006.01)
*G01R 27/26* (2006.01)
*G01R 29/08* (2006.01)

(52) U.S. Cl.
CPC .......... *G01D 5/24* (2013.01); *G01R 27/2605* (2013.01); *G01R 29/0871* (2013.01)

(58) Field of Classification Search
CPC .. G01D 5/00; G01D 5/12; G01D 5/14; G01D 5/24; G01D 5/244; G01D 5/24471; G01D 5/2448; G01R 27/00; G01R 27/02; G01R 27/26; G01R 27/2605; G01R 29/00; G01R 29/08; G01R 29/0864; G01R 29/0871; H03F 3/00; H03F 3/45; H03F 3/45071; H03F 3/45076; H03F 3/45475; H03F 3/70; H03F 2200/00; H03F 2200/231; H03F 2200/252; H03F 2200/264; H03F 2203/00; H03F 2203/45; H03F 2203/45512
USPC .......... 324/600, 649, 658, 676, 678
See application file for complete search history.

(56) References Cited

U.S. PATENT DOCUMENTS

| 8,830,207 | B1 | 9/2014 | Joharapurkar et al. |
| 9,244,569 | B2 | 1/2016 | Guedon et al. |
| 9,952,728 | B2* | 4/2018 | Hu .................. G06F 3/041661 |
| 10,025,441 | B2 | 7/2018 | Ryshtun et al. |

(Continued)

FOREIGN PATENT DOCUMENTS

| CN | 109710101 A | * | 5/2019 | ......... G06F 3/04166 |
| CN | 105808024 B | * | 4/2020 | ........... G06F 3/0416 |

(Continued)

*Primary Examiner* — Hoai-An D. Nguyen
(74) *Attorney, Agent, or Firm* — William Park & Associates Ltd.

(57) ABSTRACT

A read-out circuit includes an operational amplifier configured to receive an input voltage through a positive input terminal; a feedback capacitor connected between an output terminal of the operational amplifier and a negative input terminal of the operational amplifier; a sensor charging and discharging circuit configured to charge or discharge a sensor during a first time; a switching circuit connecting the sensor and the operational amplifier during a second time after the sensor is charged or discharged; and a duty control circuit configured to determine a duty ratio of the first time and the second time according to a capacitance of the sensor.

19 Claims, 9 Drawing Sheets

(56) References Cited

U.S. PATENT DOCUMENTS

| | | |
|---|---|---|
| 10,156,935 B2 | 12/2018 | Lee et al. |
| 2012/0218222 A1 | 8/2012 | Shen et al. |
| 2013/0278538 A1 | 10/2013 | Brunet et al. |
| 2013/0307811 A1 | 11/2013 | Hanssen et al. |
| 2017/0300148 A1 | 10/2017 | Shimada |
| 2020/0110117 A1 | 4/2020 | Jiang et al. |

FOREIGN PATENT DOCUMENTS

| | | | | |
|---|---|---|---|---|
| CN | 112965641 B | * | 9/2021 | ......... G01R 27/2605 |
| DE | 112018001005 T5 | * | 11/2019 | ......... G01R 31/3648 |
| EP | 2187241 B1 | | 9/2018 | |
| EP | 3709514 A1 | * | 9/2020 | ......... G01R 27/2605 |
| FR | 2756048 A1 | | 5/1998 | |
| JP | 2013150274 A | * | 8/2013 | ............... H03F 3/70 |
| KR | 1020150060565 A | | 6/2015 | |
| KR | 1020160020480 A | | 2/2016 | |
| KR | 101872368 B1 | | 6/2018 | |
| KR | 101909515 B1 | | 10/2018 | |

\* cited by examiner

READ-OUT CIRCUIT FOR A CAPACITIVE SENSOR

CROSS-REFERENCE TO RELATED APPLICATIONS

The present application claims priority under 35 U.S.C. § 119(a) to Korean Patent Application No. 10-2021-0072317, filed on Jun. 3, 2021, which is incorporated herein by reference in its entirety.

BACKGROUND

1. Technical Field

Various embodiments generally relate to a read-out circuit for a capacitive sensor.

2. Related Art

With the advent of the Internet of Things era, research and development on various smart devices and sensors is in progress.

In a capacitive sensor that senses a signal in a manner in which capacitance of a capacitor is changed, a read-out circuit includes a circuit that converts a change in capacitance into a voltage.

When one terminal of the capacitor is grounded in the capacitive sensor, noise is introduced through the grounded node, making it difficult to identify an accurate signal.

Accordingly, a read-out circuit capable of reading an accurate signal while reducing noise in the capacitive sensor is required.

SUMMARY

In accordance with the present teachings, a read-out circuit may include an operational amplifier configured to receive an input voltage through a positive input terminal; a feedback capacitor connected between an output terminal of the operational amplifier and a negative input terminal of the operational amplifier; a sensor charging and discharging circuit configured to charge or discharge a sensor for a first time; a switching circuit connecting the sensor and the operational amplifier for a second time after the sensor is charged or discharged; and a duty control circuit configured to determine a duty ratio of the first time and the second time according to a capacitance of the sensor.

In accordance with the present teachings, a read-out circuit may include an operational amplifier configured to receive an input voltage through a positive input terminal; a feedback capacitor connected between an output terminal and a negative input terminal of the operational amplifier; a sensor charging and discharging circuit configured to charge or discharge a sensor during a first time; an offset cancelling circuit having an offset capacitor connected between a first node and a second node and configured to charge or discharge the offset capacitor during the first time; a first switching circuit configured to provide a power supply voltage or a ground voltage to the first node during the first time; a second switching circuit configured to connect the operational amplifier with the offset cancelling circuit and to connect the offset cancelling circuit with the sensor during a second time after the sensor is charged or discharged; and a duty control circuit configured to control a duty ratio of the first time and the second time according to capacitance of the sensor or capacitance of the offset capacitor.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
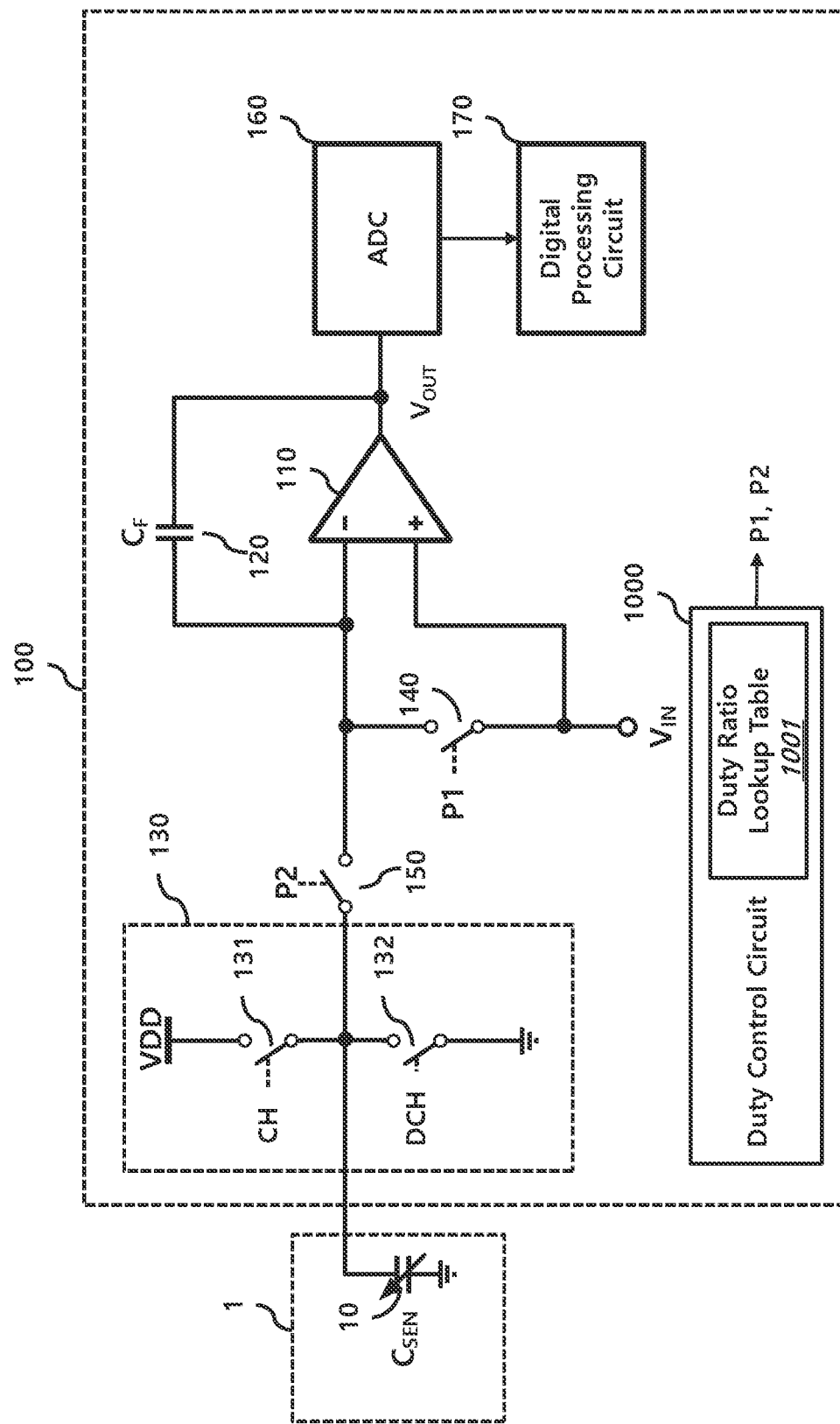
FIG. 1 shows a circuit diagram of a read-out circuit according to an embodiment of the present disclosure.

FIG. 1 is a circuit diagram illustrating a read-out circuit 100 according to an embodiment of the present disclosure.

The read-out circuit 100 detects a change in capacitance of a capacitor 10 included in a capacitive sensor 1 and generates an output voltage $V_{OUT}$ corresponding thereto.

Hereinafter, the capacitor 10 is referred to as a sensor capacitor 10. One terminal of the sensor capacitor 10 is grounded.

The read-out circuit 100 includes an operational amplifier 110 and a feedback capacitor 120.

The feedback capacitor 120 is connected between the output terminal of the operational amplifier 110 and the negative input terminal.

An input voltage $V_{IN}$ is provided to the positive input terminal of the operational amplifier 110.

The read-out circuit 100 includes a sensor charging and discharging circuit 130, a first switching circuit 140, and a second switching circuit 150.

The sensor charging and discharging circuit 130 includes a charge switch 131 that applies a power supply voltage VDD to an other terminal of the sensor capacitor 10 through the input terminal of the read-out circuit 100 to charge the sensor capacitor 10 and a discharge switch 132 for discharging the sensor capacitor 10 by grounding the other terminal.

The charge switch 131 is controlled according to the charge control signal CH, and the discharge switch 132 is controlled according to the discharge control signal DCH.

The first switching circuit 140 connects the positive input terminal and the negative input terminal of the operational amplifier 110 according to the first switching signal P1.

The second switching circuit 150 connects the other terminal of the sensor capacitor 10 and the negative input terminal of the operational amplifier 110 according to the second switching signal P2.

The duty control circuit 1000 adjusts a duty ratio of the first switching signal P1 and the second switching signal P2.

Figure 2:
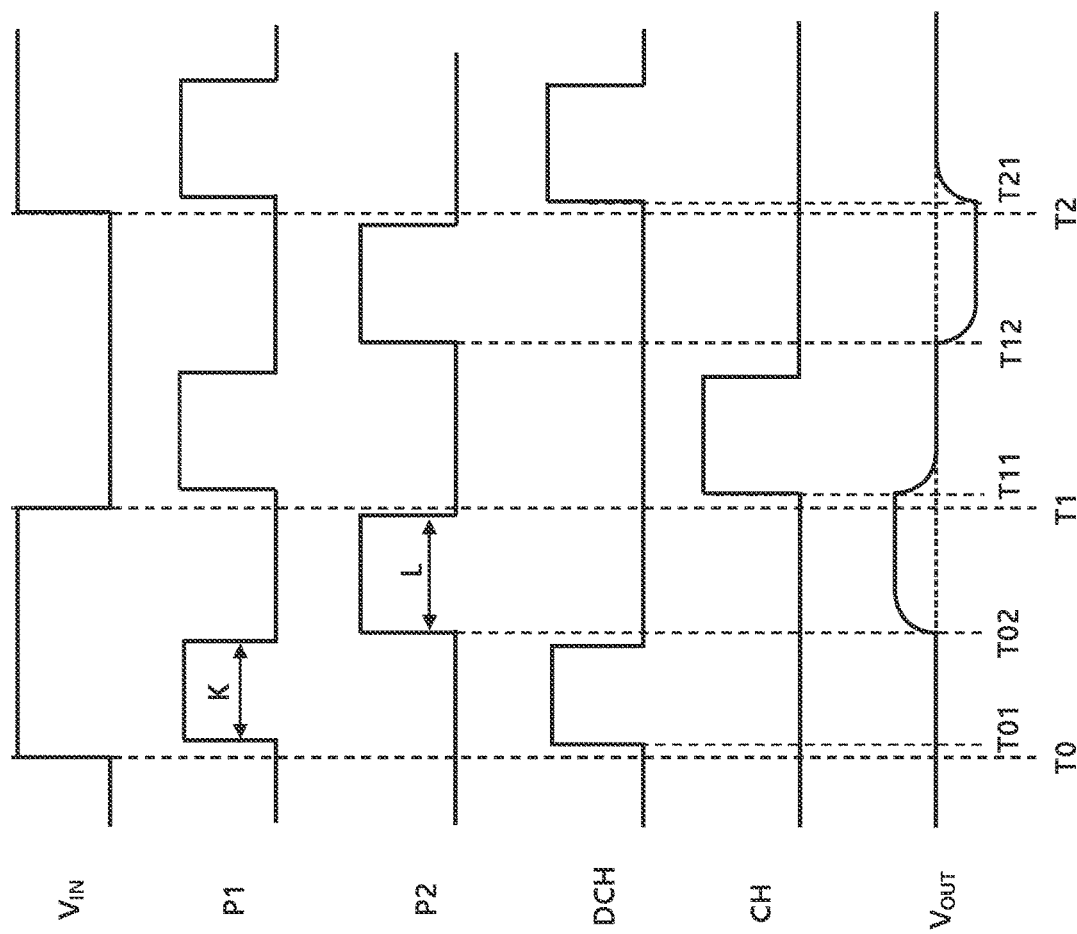
FIG. 2 shows a timing diagram illustrating an operation of a read-out circuit according to an embodiment of the present disclosure.

FIG. 2 is a timing diagram illustrating an operation of the read-out circuit 100 according to an embodiment of the present disclosure.

As the input voltage $V_{IN}$, a high level voltage is applied between T0 to T1 and a low level voltage is applied between T1 to T2.

In this embodiment, the high level voltage corresponds to the power supply voltage VDD and the low level voltage corresponds to the ground voltage.

First, an operation when the input voltage $V_{IN}$ is at the high level will be described.

After the input voltage $V_{IN}$ becomes the high level at T0, the discharge control signal DCH becomes the high level at T01 to turn on the discharge switch 132, thereby discharging the sensor capacitor 10.

The first switching signal P1 becomes the high level at substantially the same time as the discharge control signal DCH. Accordingly, the positive input terminal and the negative input terminal of the operational amplifier 110 are set to the same voltage according to the first switching circuit 140.

Thereafter, the discharge control signal DCH becomes the low level to turn off the discharge switch 132. Also, the first switching signal P1 also becomes the low level substantially at the same time, so that the positive input terminal and the negative input terminal of the operational amplifier 110 are separated.

Thereafter, when the second switching signal P2 becomes the high level at T02, the second switching circuit 150 is turned on to generate an output voltage $V_{OUT}$.

The amount of change in the output voltage $V_{OUT}$ after T02 may be calculated using the charge conservation law and the following Equation 1 is obtained.

$$\Delta V_{OUT,High} = VDD\left(\frac{C_{SEN}}{C_F}\right) \quad \text{[Equation 1]}$$

Next, an operation when the input voltage $V_{IN}$ is at the low level will be described.

After the input voltage $V_{IN}$ becomes the low level at T1, the charge control signal CH becomes the high level at T11, and the charging switch 131 is turned on, thereby charging the sensor capacitor 10.

The first switching signal P1 becomes the high level substantially at the same time as the charge control signal CH. Accordingly, the positive input terminal and the negative input terminal of the operational amplifier 110 are set to the same voltage according to the first switching circuit 140.

Thereafter, the charging control signal CH becomes the low level, and the charging switch 131 is turned off. Also, the first switching signal P1 becomes the low level substantially at the same time, so that the positive input terminal and the negative input terminal of the operational amplifier 110 are separated.

Thereafter, when the second switching signal P2 becomes the high level at T12, the second switching circuit 150 is turned on to generate the output voltage $V_{OUT}$.

The amount of change in the output voltage $V_{OUT}$ after T12 may be calculated using the charge conservation law and the following Equation 2 is obtained.

$$\Delta V_{OUT,Low} = -VDD\left(\frac{C_{SEN}}{C_F}\right) \quad \text{[Equation 2]}$$

Equation 3 may be derived from Equations 1 and 2.

$$\Delta V_{OUT,High} - \Delta V_{OUT,Low} = 2VDD\left(\frac{C_{SEN}}{C_F}\right) \quad \text{[Equation 3]}$$

As shown in Equation 3, capacitance of the sensor capacitor is measured from the difference of the amount of change in the output voltage between when the input voltage is at the high level and when the input voltage is at the low level, thereby cancelling noise in the input voltage, the power supply voltage and the ground voltage.

The read-out circuit 100 includes an analog-to-digital converter (ADC) 160 that converts the output voltage $V_{OUT}$ of the operational amplifier 110 into a digital signal, and a digital processing circuit 170 that processes the digital signal output from the ADC 160 may be further included.

The ADC 160 may convert the output voltage $V_{OUT}$, for example, when the first switching signal P1 transitions to the low level and when the second switching signal P2 transitions to the low level.

The digital processing circuit 170 may calculate the difference between two digital signals corresponding to two output voltages from the ADC 160 to measure the amount of change in the output voltage, and accordingly, the values corresponding to Equations 1 and 2 may be obtained. Thereafter, a value corresponding to Equation 3 may be obtained through an additional operation.

The duty control circuit 1000 controls a duty ratio that is a ratio of a width of K in which the first switching signal P1 is at the high level and a width of L in which the second switching signal P2 is at the high level.

In this embodiment, as the duty ratio increases, the width of L increases compared to the width of K.

The time it takes for the output voltage $V_{OUT}$ to converge after T02 or after T12 may vary according to the capacitance of the sensor capacitor.

For example, if the width of L in which the second switching signal P2 is at the high level is not long enough, the operation is terminated in a state in which the output voltage $V_{OUT}$ is not converged, so that the value of the sensor cannot be accurately read.

For example, in the present embodiment, when the capacitance of the sensor capacitor is large, the time it takes for the output voltage $V_{OUT}$ to converge increases.

In this embodiment, by adjusting the duty ratio according to the capacitance of the sensor capacitor, sufficient time is ensured for the output voltage $V_{OUT}$ to converge after T02 or T12, thereby ensuring that the sensor value can be read more accurately.

In FIG. 1, it is assumed that the capacitance $C_{SEN}$ of the sensor capacitor 10 is known in advance, and that the duty ratio is predetermined according to the capacitance $C_{SEN}$ of the sensor capacitor 10.

In FIG. 1, the duty control circuit 1000 outputs a first switching signal P1 and a second switching signal P2 having a duty ratio corresponding to the known capacitance $C_{SEN}$ of the sensor capacitor 10.

The generation of the first switching signal P1 and the second switching signal P2 of FIG. 2 according to the duty ratio can be easily implemented by a person skilled in the art with reference to the prior art, and thus a detailed description thereof will be omitted.

In order to determine a duty ratio corresponding to the capacitance $C_{SEN}$ of the sensor capacitor 10, a duty ratio lookup table 1001 may be generated in advance.

Figure 3:
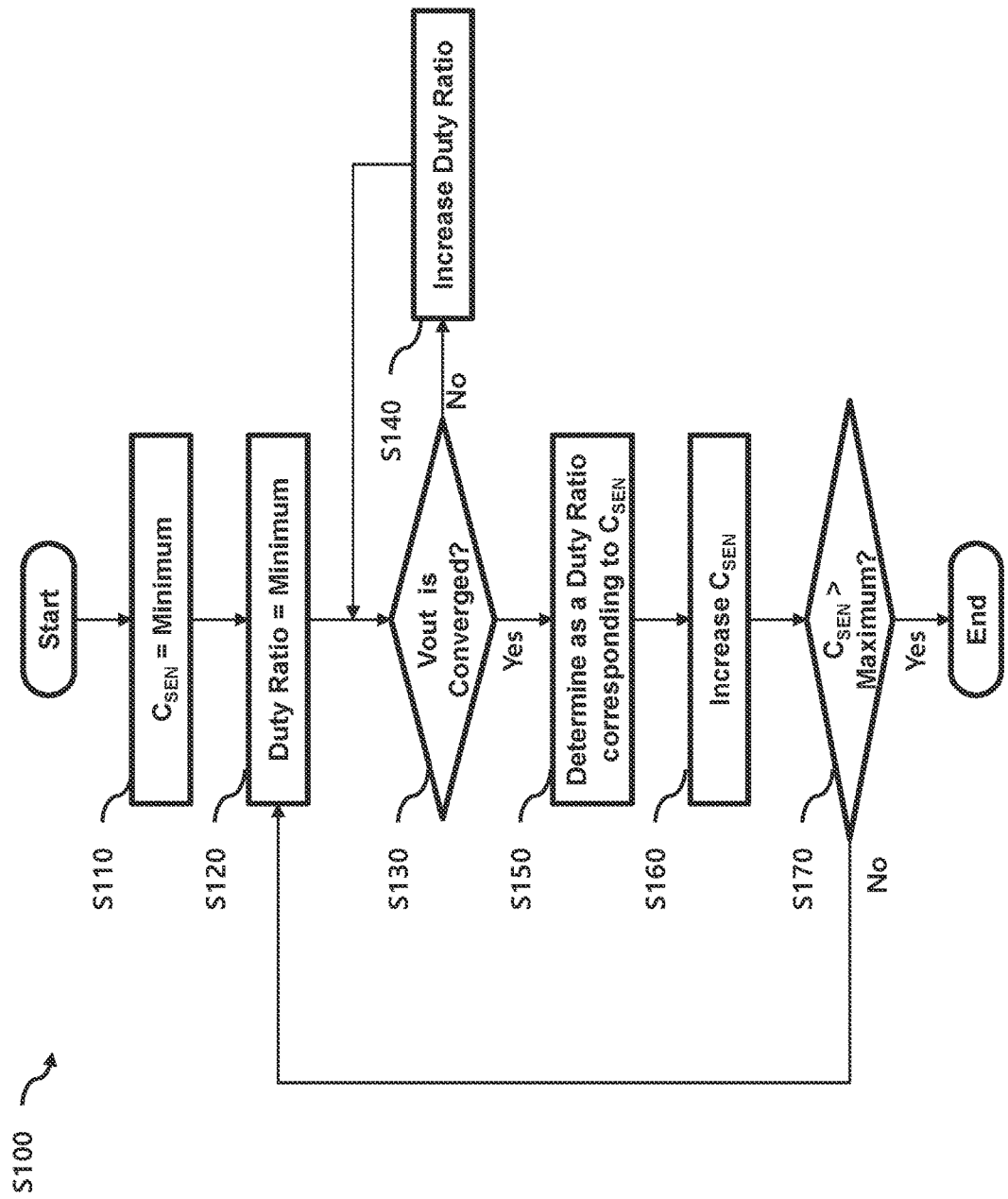
FIG. 3 shows a flow chart illustrating a procedure to generate a duty ratio lookup table according to an embodiment of the present disclosure.

FIG. 3 is a flowchart illustrating a procedure for generating a duty ratio lookup table 1001 according to an embodiment of the present disclosure.

First, the capacitance $C_{SEN}$ of the sensor capacitor is set to a minimum value at S110. The minimum and maximum values of the capacitance $C_{SEN}$ of the sensor capacitor may be variously set according to embodiments.

Next, the duty ratio is set to a minimum value at S120. The minimum value and the maximum value of the duty ratio may be variously set according to an embodiment.

Thereafter, it is determined whether the output voltage $V_{OUT}$ converges at S130.

For example, it is determined whether the output voltage $V_{OUT}$ is converged at T1 while performing the operation between T0 to T11 of FIG. 2.

The output voltage may be determined to be converged when rate of change of the output voltage becomes smaller than a predetermined value, for example, 1%.

If the output voltage $V_{OUT}$ is not converged, the duty ratio is increased and the step S130 is repeated after the duty ratio is increased at S140.

When the output voltage $V_{OUT}$ is converged, current duty ratio is stored as the duty ratio corresponding to the capacitance $C_{SEN}$ of the sensor capacitor in the lookup table 1001 at S160.

Thereafter, the capacitance $C_{SEN}$ of the sensor capacitor is increased at S160.

If the capacitance $C_{SEN}$ of the sensor capacitor is greater than the maximum value, the process is terminated. Otherwise, the process returns to S120 to repeat the above-described operations.

As a result of performing the operation of FIG. 3, a duty ratio lookup table 1001 corresponding to various capacitance of the sensor capacitor may be completed.

When the actual capacitance of the sensor capacitor is not included in the duty ratio lookup table 1001, a duty ratio corresponding to the capacitance of the sensor capacitor may be determined using a conventional technique such as an interpolation technique.

Figure 4:
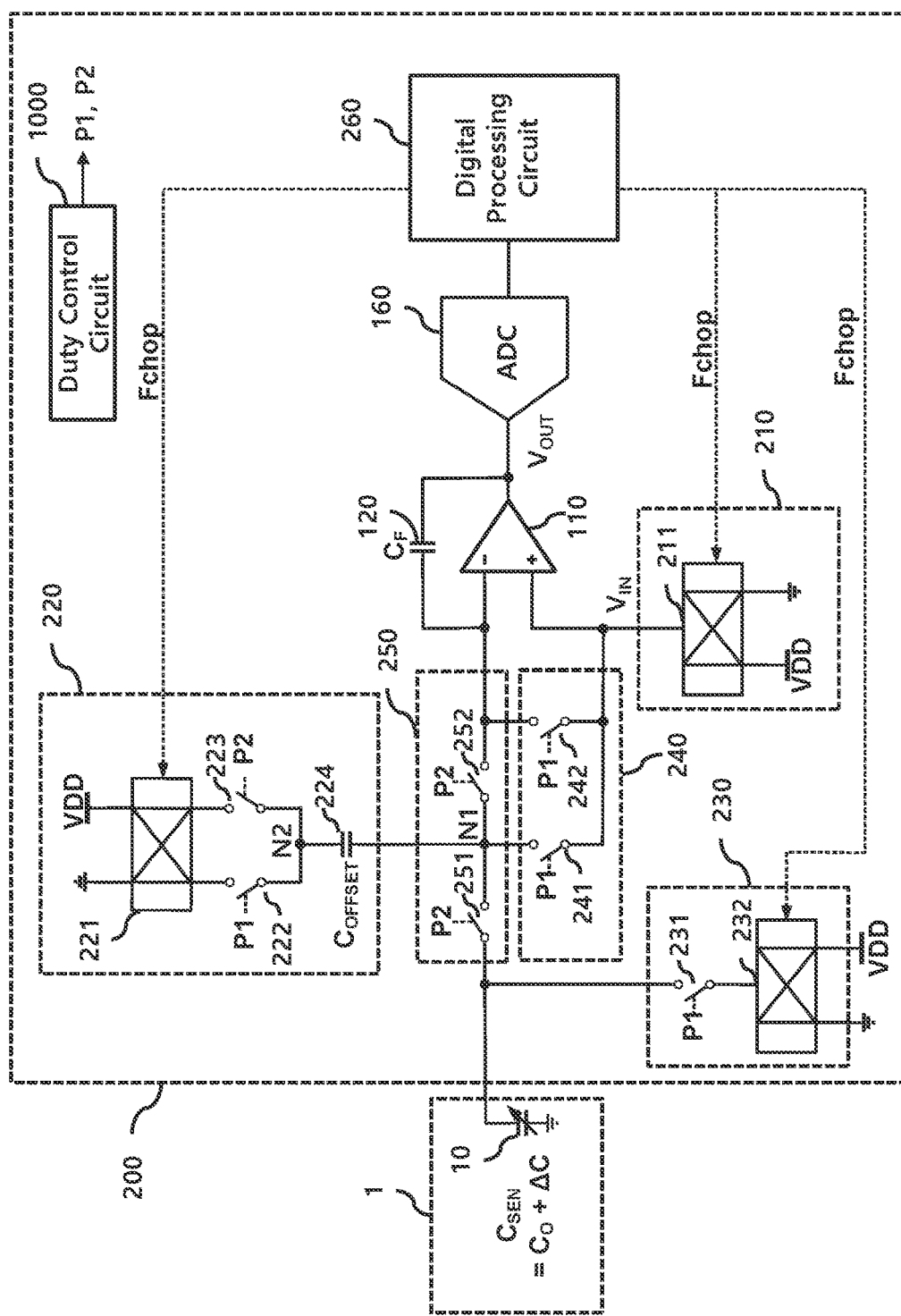
FIG. 4 shows a circuit diagram of a read-out circuit according to an embodiment of the present disclosure.

FIG. 4 is a circuit diagram illustrating a read-out circuit 200 according to an embodiment of the present disclosure.

FIG. 4 illustrates a read-out circuit 200 corresponding to a case in which the sensor capacitor 10 included in the sensor 1 has an offset capacitance.

The capacitance $C_{SEN}$ of the sensor capacitor 10 may be expressed as the sum of the offset capacitance Co and the variable capacitance $\Delta C$.

The offset capacitance Co corresponds to a value that is kept constant regardless of the sensing operation, and the variable capacitance $\Delta C$ corresponds to a value that varies according to the sensing operation.

Since the sensing result is affected by the variable capacitance $\Delta C$, if the offset capacitance Co is not 0, the difference in output voltage in Equation 3 cannot be expressed only with the variable capacitance $\Delta C$, so correction to remove the offset capacitance Co is required for accurate sensing.

The embodiment of FIG. 4 provides a read-out circuit 200 that does not require an additional correction operation by removing the effect of the offset capacitance Co.

In this embodiment, the read-out circuit 200 includes an operational amplifier 110 and a feedback capacitor 120.

The feedback capacitor 120 is connected between the output terminal of the operational amplifier 110 and the negative input terminal.

An input voltage $V_{IN}$ is provided to the positive input terminal of the operational amplifier 110.

The read-out circuit 200 further includes a voltage input circuit 210, an offset cancelling circuit 220, a sensor charging and discharging circuit 230, a first switching circuit 240 and a second switching circuit 250, an ADC 160 and a digital processing circuit 260.

The voltage input circuit 210 includes a first power switching circuit 211 that provides the power supply voltage VDD or the ground voltage as an input voltage $V_{IN}$ according to the power switching signal $F_{chop}$.

The first power switching circuit 211 provides the power supply voltage as the input voltage $V_{IN}$ when the power switching signal $F_{chop}$ is at the high level, and applies the ground voltage to the input voltage $V_{IN}$ when the power switching signal $F_{chop}$ is at the low level.

The offset cancelling circuit 220 includes a second power switching circuit 221, switches 222 and 223, and an offset capacitor 224.

The offset capacitor 224 is connected between the first node N1 and the second node N2.

One terminal of each of the switches 222 and 223 is connected to the second power switching circuit 221, and an other terminal of each of the switches 222 and 223 is connected to the second node N2.

The switch 222 is turned on or turned off according to the first switching signal P1 and the switch 223 is turned on or turned off according to the second switching signal P2.

The second power switching circuit 221 provides the ground voltage to the one terminal of the switch 222 and the power supply voltage VDD to the one terminal of the switch 223 when the power switching signal $F_{chop}$ is at the high level.

Also, when the power switching signal $F_{chop}$ is at the low level, the second power switching circuit 221 provides the power supply voltage to the one terminal of the switch 222 and the ground voltage to the one terminal of the switch 223.

The sensor charging and discharging circuit 230 includes a switch 231 and a third power switching circuit 232.

One terminal of the switch 231 is connected to the sensor 1 through an input terminal of the read-out circuit 200, and an other terminal is connected to the third power switching circuit 232.

The switch 231 is turned on or turned off according to the first switching signal P1.

The third power switching circuit 232 provides the ground voltage to the other terminal of the switch 231 when the power switching signal $F_{chop}$ is at the high level, and applies the power supply voltage to the switch 231 when the power switching signal $F_{chop}$ is at the low level.

The first switching circuit 240 includes a switch 241 connected between the first node N1 and the positive input terminal of the operational amplifier 110 and a switch 242 connected between the positive input terminal and the negative input terminal of the operational amplifier 110. The switches 241 and 242 are turned on or turned off according to the first switching signal P1.

The second switching circuit 250 includes a switch 251 connected between the sensor 1 and the first node N1 and a switch 252 connected between the first node N1 and the negative input terminal of the operational amplifier 110. The switches 251 and 252 are turned on or turned off according to the second switching signal P2.

The ADC 160 converts the output voltage $V_{OUT}$ provided from the operational amplifier 110 into a digital signal.

The digital processing circuit 260 performs a signal processing operation using the digital signal output from the ADC 160.

In addition, the digital processing circuit 260 outputs the power switching signal $F_{chop}$ to control the first to third power switching circuits 211, 221, and 232.

In general, the offset capacitance Co of the sensor capacitor 10 is large compared to the variable capacitance ΔC. For example, when the offset capacitance Co is 300 pF, the variable capacitance ΔC is at a level of 2 to 3 pF, and the duty control circuit 1000 may use the offset capacitance as a reference in determining the duty ratio.

Accordingly, in the embodiment of FIG. 4, the duty control circuit 1000 may use the capacitance $C_{OFFSET}$ of the offset capacitor 224 as the capacitance $C_{SEN}$ of the sensor capacitor 10.

That is, the duty control circuit 1000 may adjust and output the duty ratio of the first switching signal P1 and the second switching signal P2 according to the capacitance $C_{OFFSET}$ of the offset capacitor 224.

That is, when the capacitance $C_{OFFSET}$ of the offset capacitor 224 is large, it is considered that the capacitance of the sensor capacitor 10 is large, so that the duty ratio may be increased to increase the period in which the second switching signal P2 is at the high level.

Figure 5:
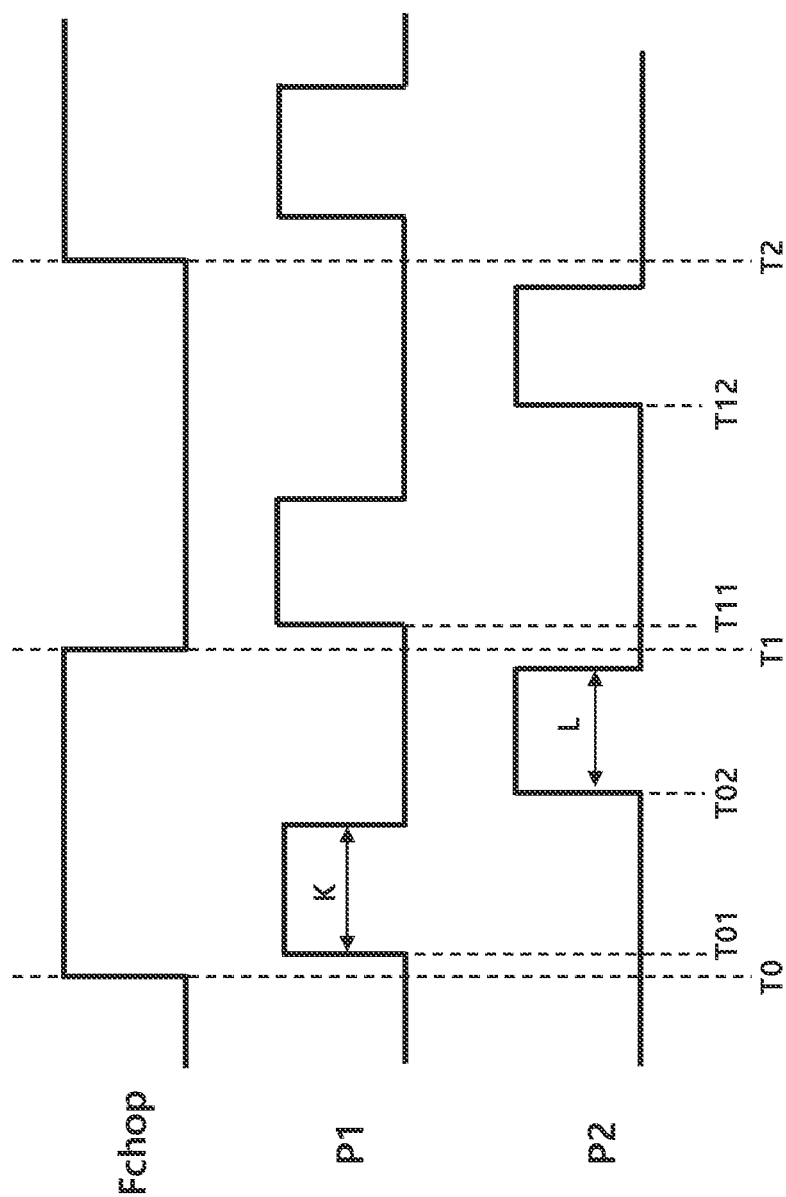
FIG. 5 shows a timing diagram illustrating an operation of a read-out circuit according to an embodiment of the present disclosure.

FIG. 5 is a timing diagram illustrating an operation of the read-out circuit 200 of FIG. 3.

The power switching signal $F_{chop}$ has the high level between T0 to T1 and has the low level between T1 to T2.

First, an operation when the power switching signal $F_{chop}$ is at the high level will be described.

According to the operation of the first power switching circuit 211, the input voltage $V_{IN}$ has the high level, that is, the power supply voltage.

After the power switching signal $F_{chop}$ becomes the high level at T0, the first switching signal P1 becomes the high level at T01, the switch 231 is turned on, and the ground voltage provided from the third power switching circuit 232 is applied to the sensor 1 to discharge the sensor capacitor 10.

At this time, the switch 241 is turned on to apply the power supply voltage to the first node N1, and the ground voltage provided through the second power switching circuit 221 is provided to the second node N2 through the switch 222.

Hereinafter, it is expressed that the offset capacitor 224 is charged in the positive direction when a positive charge is charged in the first node N1 and that the offset capacitor 224 is charged in the negative direction when a negative charge is charged in the first node N1.

Accordingly, the sensor capacitor 10 is discharged and the offset capacitor 224 is charged in a positive direction.

In addition, since the switch 242 is turned on, voltages of the positive input terminal and the negative input terminal of the operational amplifier 110 are set to be the same.

Thereafter, the first switching signal P1 becomes the low level to turn off the switches 222, 231, 241, and 242, and then at T02, the second switching signal P2 becomes the high level to turn on the switches 251 and 252.

In this case, the power supply voltage provided through the second power switching circuit 221 is provided to the second node N2 through the switch 223.

Accordingly, the charge charged in the offset capacitor 224 is transferred to the sensor capacitor 10 and the feedback capacitor 120.

The amount of change in the output voltage $V_{OUT}$ after T02 may be calculated using the charge amount conservation characteristic and the following Equation 4 is obtained.

$$\Delta V_{OUT,High} = VDD\left(\frac{(\Delta C + Co) - C_{OFFSET}}{C_F}\right) \quad \text{[Equation 4]}$$

The ADC 160 may digitally convert the output voltage $V_{OUT}$, for example, when the first switching signal P1 transitions to the low level and when the second switching signal P2 transitions to the low level.

The digital processing circuit 260 may calculate the amount of change in the output voltage $V_{OUT}$ according to Equation 4.

Next, an operation when the power switching signal $F_{chop}$ is at the low level will be described.

According to the operation of the first power switching circuit 211, the input voltage $V_{IN}$ has the low level, that is, the ground voltage.

After the power switching signal $F_{chop}$ and the input voltage $V_{IN}$ become the low level at T1, the first switching signal P1 becomes the high level at T11, the switch 231 is turned on, and a power supply voltage provided from the third power switching circuit 232 is applied to the sensor 1 to charge the sensor capacitor 10.

At this time, the switch 241 is turned on, and the ground voltage is applied to the first node N1 and the power supply voltage provided from the second power switching circuit 221 is applied to the second node N2 via the switch 222.

Accordingly, the sensor capacitor 10 is charged, and the offset capacitor 224 is also charged in a negative direction.

In addition, since the switch 242 is turned on, the positive input terminal and the negative input terminal of the operational amplifier 110 are set to the same voltage.

Thereafter, the first switching signal P1 becomes the low level to turn off the switches 222, 231, 241, and 242, and then at T12, the second switching signal P2 becomes the high level to turn on the switches 251 and 252.

In this case, the ground voltage provided through the second power switching circuit 221 is provided to the second node N2 through the switch 223, and the charge charged in the offset capacitor 224 is provided to the first node N1.

The amount of change in the output voltage $V_{OUT}$ after T12 is calculated using the charge amount conservation characteristic and the following Equation 5 may be derived.

$$\Delta V_{OUT,Low} = -VDD\left(\frac{(\Delta C + Co) - C_{OFFSET}}{C_F}\right) \quad \text{[Equation 5]}$$

The ADC 160 may digitally convert the output voltage $V_{OUT}$, for example, when the first switching signal P1 transitions to the low level and when the second switching signal P2 transitions to the low level.

The digital processing circuit 260 may calculate the amount of change in the output voltage $V_{OUT}$ as shown in Equation 5.

Before starting the sensing operation, the capacitance $C_{OFFSET}$ of the offset capacitor 224 corresponds to the offset capacitance Co of the sensor capacitor 10.

The capacitance $C_{OFFSET}$ of the offset capacitor 224 may be predetermined to be equal to the offset capacitance Co.

In this case, since the value of Co–$C_{OFFSET}$ becomes 0 in Equations 4 and 5, Equation 6 can be derived from Equations 4 and 5 like the following.

$$\Delta V_{OUT,High} - \Delta V_{OUT,Low} = 2VDD\left(\frac{\Delta C}{C_F}\right) \quad \text{[Equation 6]}$$

The digital processing circuit 260 may calculate the difference in the amount of change of the output voltage $V_{OUT}$ according to Equation 6.

As shown in Equation 6, capacitance of the sensor capacitor 10 is measured from the difference in the amount of change in the output voltage between when the input voltage is at the high level and when the input voltage is at the low level, thereby cancelling noise in the input voltage, a power supply, and a ground voltage.

However, when the width of L in which the second switching signal P2 is at the high level is not long enough, the output voltage $V_{OUT}$ may not converge to the voltages described in Equations 4 and 5.

Accordingly, as described above, the duty ratio is adjusted so that the output voltage $V_{OUT}$ can converge in consideration of the capacitance $C_{SEN}$ of the sensor capacitor 10, and the duty control circuit 1000 may adjust the duty ratio of the first switching signal P1 and the second switching signal P2 according to the capacitance $C_{OFFSET}$ of the offset capacitor 224.

Since the capacitance $C_{OFFSET}$ of the offset capacitor 224 must be set equal to the offset capacitance Co of the sensor capacitor 10, it is difficult to actually implement the offset capacitor 224 when the offset capacitance Co of the sensor capacitor 10 is large.

Figure 6:
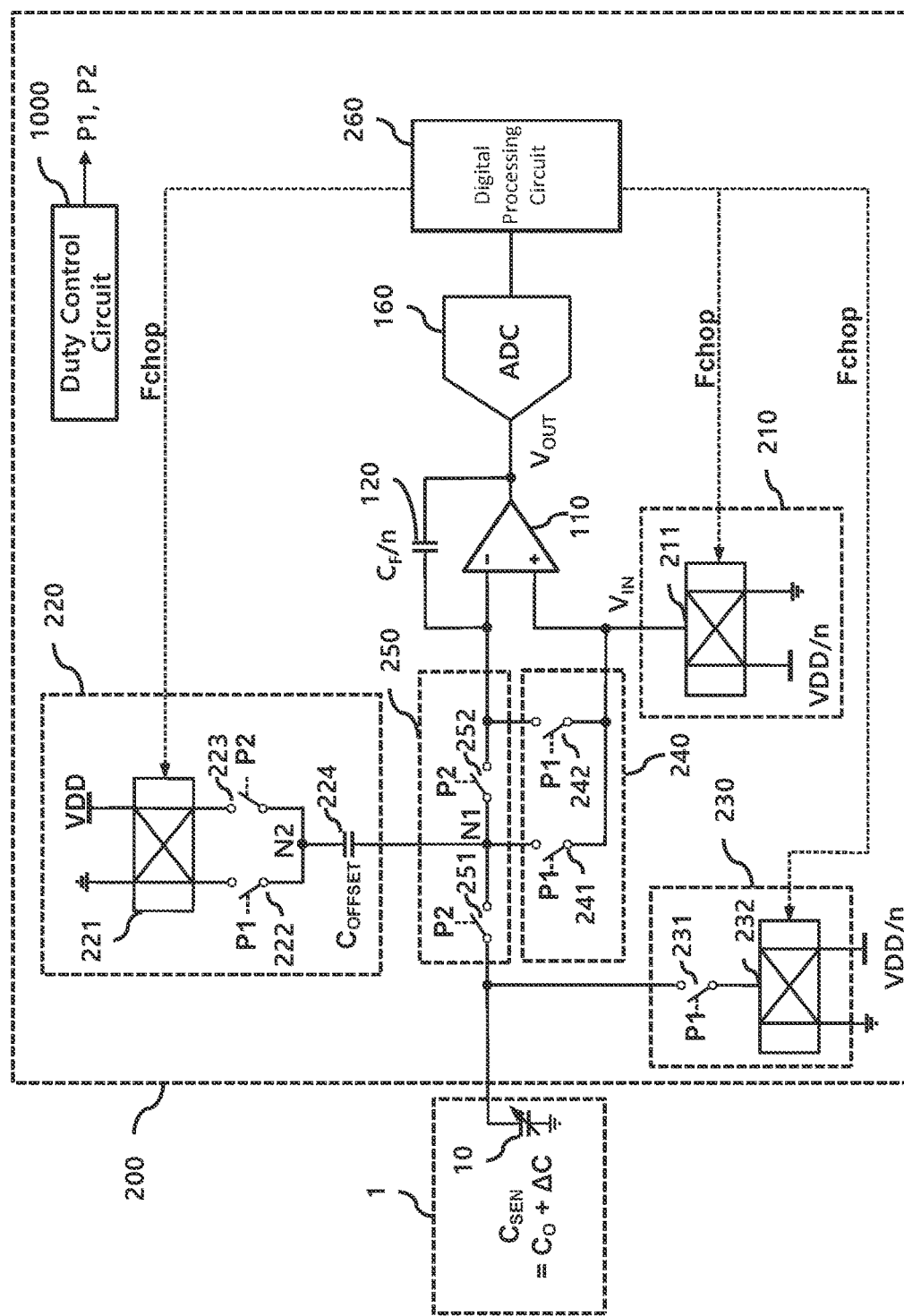
FIGS. 6, 7 and 8 show circuit diagrams of read-out circuits according to embodiments of the present disclosure.

Like FIG. 6, when the power supply voltage provided to the first power switching circuit 211 and the third power switching circuit 232 is reduced by 1/n and the capacitance of the feedback capacitor 120 is reduced by 1/n, Equations 4 and 5 may be transformed like equations 7 and 8, where n is a real number greater than 1.

$$\Delta V_{OUT,High} = VDD\left(\frac{(\Delta C + Co) - nC_{OFFSET}}{C_F}\right) \quad \text{[Equation 7]}$$

$$\Delta V_{OUT,Low} = -VDD\left(\frac{(\Delta C + Co) - nC_{OFFSET}}{C_F}\right) \quad \text{[Equation 8]}$$

Equations 7 and 8 indicate that the capacitance of the offset capacitor 224 is increased n times compared to the actual capacitance. Accordingly, the capacitance $C_{OFFSET}$ of the offset capacitor 224 may be decreased by 1/n of the offset capacitance Co of the sensor capacitor 10.

Accordingly, the duty control circuit 1000 considers the capacitance $C_{SEN}$ of the sensor capacitor as n times the capacitance $C_{OFFSET}$ of the offset capacitor 224 and adjusts the duty ratio of the first switching signal P1 and the second switching signal P2.

Figure 7:
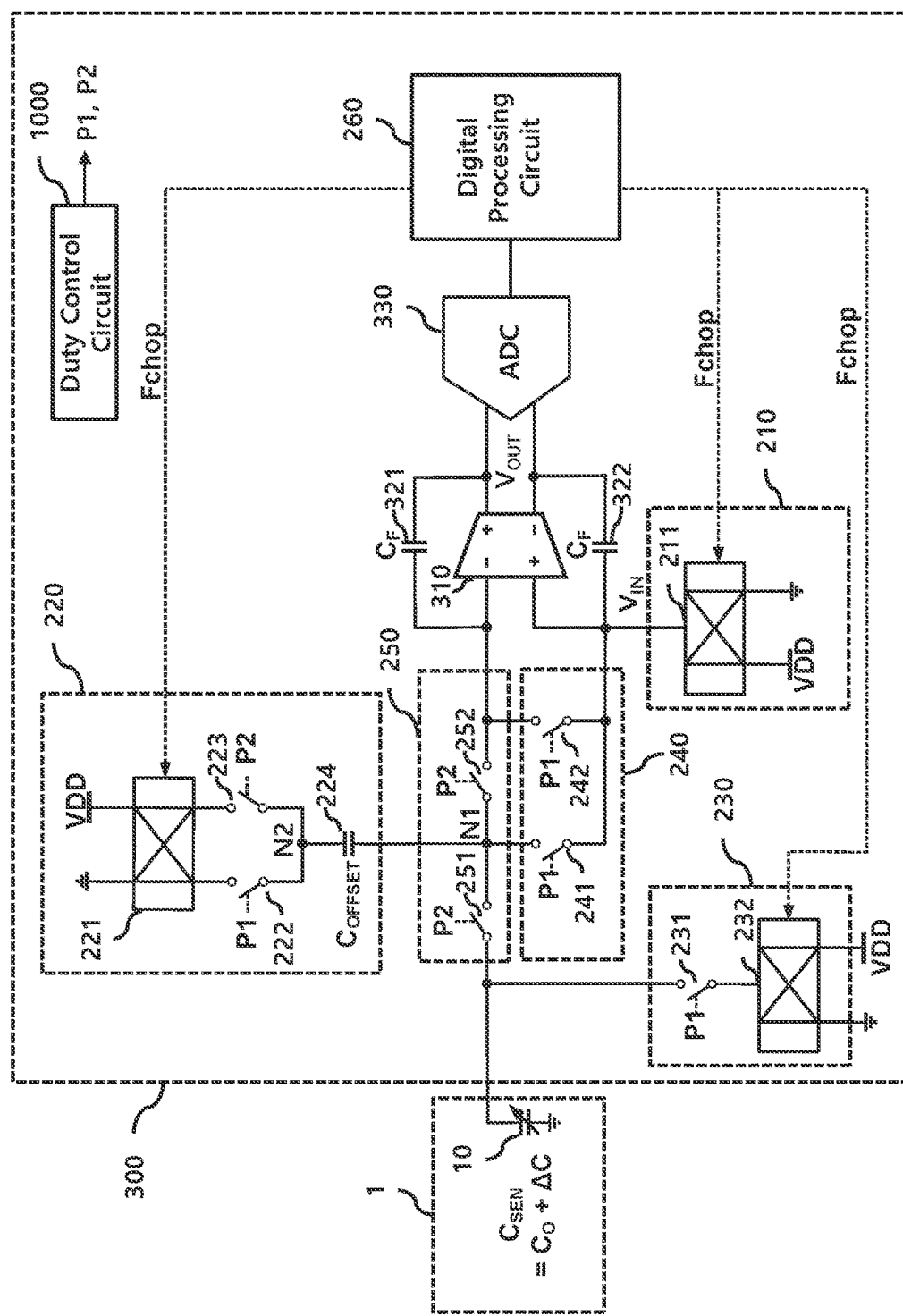

FIG. 7 is a circuit diagram illustrating a read-out circuit 300 according to another embodiment of the present disclosure.

The read-out circuit 300 of FIG. 7 includes a differential operational amplifier 310, an ADC 330, and two feedback capacitors 321 and 322.

The feedback capacitor 321 is connected between a negative input terminal and a positive output terminal of the operational amplifier 310, and the feedback capacitor 322 is connected between a positive input terminal and a negative output terminal of the operational amplifier 310.

It is well known that when a differential circuit is used, signal-to-noise ratio (SNR) characteristic can be improved by reducing the noise of the amplifier and increasing the amplitude of the output signal.

Except for this, the configuration and operation are substantially the same as those of the read-out circuit 200 of FIG. 3, and thus a repetitive description will be omitted.

Figure 8:
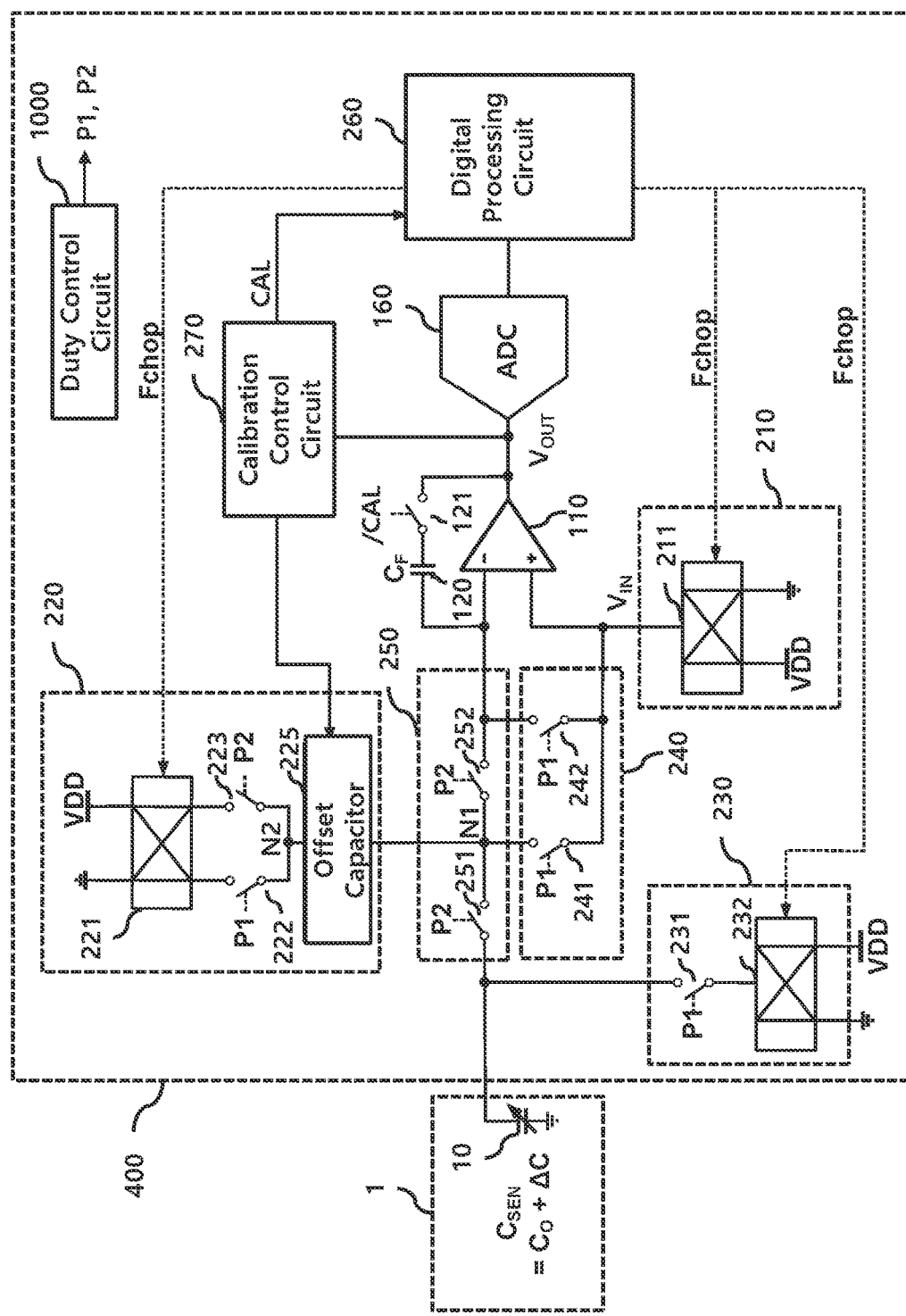

FIG. 8 is a circuit diagram illustrating a read-out circuit 400 according to another embodiment of the present disclosure.

The read-out circuit 400 of FIG. 8 further includes a calibration control circuit 270 that controls a calibration operation.

In this case, the capacitance of the offset capacitor 225 may be adjusted according to the control of the calibration control circuit 270.

Figure 9:
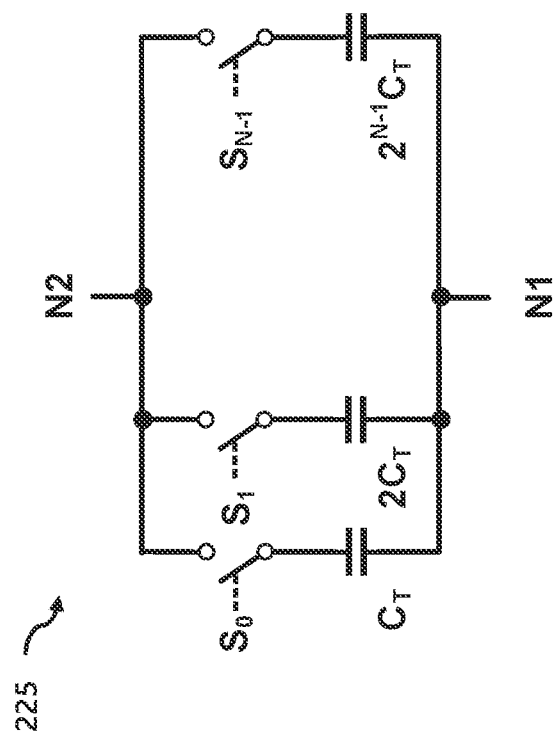
FIG. 9 shows an offset capacitor according to an embodiment of the present disclosure.

FIG. 9 is a circuit diagram illustrating the offset capacitor 225 according to an embodiment of the present disclosure.

The offset capacitor 225 includes N capacitors whose capacitance are sequentially increased by two times, and are connected between the first node N1 and the second node N2 through a plurality of switches.

A plurality of switches are controlled according to control bits $S_0, S_1, \ldots, S_{N-1}$ provided from the calibration control circuit 270, where N is a natural number equal to or greater than 2.

In FIG. 8, the read-out circuit 400 further includes a feedback connection switch 121 and blocks the feedback path of the operational amplifier 110 when the calibration signal CAL is activated.

Accordingly, during the calibration operation, the operational amplifier 100 operates like a comparator.

The calibration operation may be performed before the sensing operation.

In this case, the variable capacitance $\Delta C$ is 0, and the capacitance of the sensor capacitor 10 corresponds to the offset capacitance Co.

In the present embodiment, the calibration control circuit 270 determines states of switches included in the offset capacitor 225 according to a successive approximation method.

The calibration control circuit 270 sequentially determines values from the most significant bit $S_{N-1}$ to the least significant bit $S_0$.

For example, the method of determining the value of $S_{N-1}$ is as follows.

First, the calibration control circuit 270 sets $S_{N-1}$ to the high level and sets all of $S_0$ to $S_{N-2}$ to the low level.

During the calibration operation, the power switching signal $F_{chop}$ is fixed to the low level.

That is, the input voltage $V_{IN}$ is fixed to the ground voltage, the second power switching circuit 221 provides the power supply voltage to the switch 222 and the ground voltage to the switch 223, and the third power switching circuit 232 provides the power supply voltage to the switch 231.

In this state, as in T1 to T2 of FIG. 5, the first switching signal P1 and the second switching signal P2 are sequentially turned on.

When the first switching signal P1 is turned on, the sensing capacitor 10 is charged according to the power supply voltage.

In addition, the ground voltage is provided to the first node N1 and the power supply voltage is provided to the second node N2, so that the offset capacitor 225 is charged in a negative direction.

Afterwards, when the first switching signal P1 becomes the low level and the second switching signal P2 becomes the high level, the ground voltage is applied to the second node N2 and the sensing capacitor 10 and the offset capacitor 225 is commonly connected to the first node N1.

When the capacitance of the sensing capacitor 10 is larger, the voltage of the first node N1 becomes a positive voltage, so that the operational amplifier 110 outputs the ground voltage, that is, the low level voltage.

Conversely, when the capacitance of the currently set offset capacitor 225 is larger, the voltage of the first node N1 becomes a negative voltage, and the operational amplifier 110 outputs the power supply voltage, that is, the high level voltage.

The calibration control circuit 270 sets a value of the $S_{N-1}$ as the high level when the output voltage $V_{OUT}$ is at the low level, and otherwise sets a value of the $S_{N-1}$ as the low level.

Thereafter, the calibration operation is repeated for the lower bits in the same manner to determine the capacitance $C_{OFFSET}$ of the offset capacitor 225 to be substantially the same as the offset capacitance Co of the sensor capacitor 10.

The duty control circuit 1000 considers the capacitance $C_{OFFSET}$ of the offset capacitor determined through the calibration operation as the capacitance $C_{SEN}$ of the sensor capacitor and adjusts the duty ratio of the first switching signal P1 and the second switching signal P2.

When the calibration operation is completed, the sensing operation may be performed as described above, and description thereof will not be repeated.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A read-out circuit comprising:
   an operational amplifier configured to receive an input voltage through a positive input terminal;
   a feedback capacitor connected between an output terminal of the operational amplifier and a negative input terminal of the operational amplifier;
   a sensor charging and discharging circuit configured to charge or discharge a sensor during a first time;
   a switching circuit connecting the sensor and the operational amplifier during a second time after the sensor is charged or discharged; and
   a duty control circuit configured to determine a duty ratio of the first time and the second time according to a capacitance of the sensor.

2. The read-out circuit of claim 1, further comprising a switching circuit connecting a positive input terminal and the negative input terminal of the operational amplifier.

3. The read-out circuit of claim 1, further comprising:
   an analog-to-digital converter (ADC) configured to convert an output of the operational amplifier into a digital signal; and
   a digital processing circuit configured to perform an operation with the digital signal.

4. The read-out circuit of claim 3, wherein the digital processing circuit determines change in capacitance of the sensor capacitor by operating a difference between first change of an output voltage of the operational amplifier after the second time when the sensor is charged during the first time and second change of an output voltage of the operational amplifier after the second time when the sensor is discharged during the first time.

5. A read-out circuit comprising:
   an operational amplifier configured to receive an input voltage through a positive input terminal;
   a feedback capacitor connected between an output terminal and a negative input terminal of the operational amplifier;
   a sensor charging and discharging circuit configured to charge or discharge a sensor during a first time;
   an offset cancelling circuit having an offset capacitor connected between a first node and a second node and configured to charge or discharge the offset capacitor during the first time;
   a first switching circuit configured to provide a power supply voltage or a ground voltage to the first node during the first time;
   a second switching circuit configured to connect the operational amplifier with the offset cancelling circuit and to connect the offset cancelling circuit with the sensor during a second time after the sensor is charged or discharged; and
   a duty control circuit configured to control a duty ratio of the first time and the second time according to capacitance of the sensor or capacitance of the offset capacitor.

6. The read-out circuit of claim 5, further comprising a switching circuit connecting a positive input terminal and the negative input terminal of the operational amplifier.

7. The read-out circuit of claim 5, further comprising:
   an analog-to-digital converter (ADC) configured to convert an output of the operational amplifier into a digital signal; and
   a digital processing circuit configured to perform an operation with the digital signal.

8. The read-out circuit of claim 5, wherein the offset cancelling circuit controls so that a voltage provided to the second node during the first time is different from a voltage provided to the second node during the second time.

9. The read-out circuit of claim 8, further comprising a first power switching circuit selecting a power supply voltage or a ground voltage as the input voltage according to a power switching signal,
   wherein the offset cancelling circuit further includes a second power switching circuit selecting the power supply voltage or the ground voltage according to the power switching signal, and
   wherein the sensor charging and discharging circuit further includes a third power switching circuit selecting the power supply voltage or the ground voltage according to the power switching signal.

10. The read-out circuit of claim 9, wherein capacitance of the offset capacitor is set to offset capacitance of a sensor capacitor included in the sensor.

11. The read-out circuit of claim 10, wherein when capacitance of the offset capacitor is decreased to 1/n times of offset capacitance of the sensor capacitor, power supply voltages selected at the first power switching circuit and the third power switching circuit are decreased by 1/n, and capacitance of the feedback capacitor is decreased by 1/n, the duty control circuit determines a duty ratio of the first time and the second time according to n times of capacitance of the offset capacitor.

12. The read-out circuit of claim 9, wherein when the power switching signal is at a high level,
the first power switching circuit selects the power supply voltage as the input voltage,
the offset cancelling circuit provides the ground voltage to the second node, the first switching circuit provides the power supply voltage to the first node, and the sensor charging and discharging circuit provides the ground voltage to the sensor during the first time, and
the offset cancelling circuit provides the power supply voltage to the second node during the second time.

13. The read-out circuit of claim 9, wherein when the power switching signal is at a low level,
the first power switching circuit selects the ground voltage as the input voltage,
the offset cancelling circuit provides the power supply voltage to the second node, the first switching circuit provides the ground voltage to the first node, and the sensor charging and discharging circuit provides the power supply voltage to the sensor during the first time, and
the offset cancelling circuit provides the ground voltage to the second node during the second time.

14. The read-out circuit of claim 5, wherein the operational amplifier includes a positive output terminal and a negative output terminal,
wherein the feedback capacitor is connected between the positive output terminal and the negative input terminal, and wherein the read-out circuit further includes a feedback capacitor connected between the negative output terminal and the positive input terminal.

15. The read-out circuit of claim 5, further comprising a calibration control circuit configured to set capacitance of the offset capacitor to be same as capacitance of the offset capacitor according to an output of the operational amplifier during a calibration operation.

16. The read-out circuit of claim 15, wherein the duty control circuit determines a duty ratio between the first time and the second time according to capacitance of the offset capacitor after calibration operation is finished.

17. The read-out circuit of claim 15, further comprising a switch disconnecting the feedback capacitor and the operational amplifier during the calibration operation.

18. The read-out circuit of claim 15, wherein when the calibration operation is performed, the input voltage is fixed as the ground voltage, the power supply voltage is provided to the sensor, the ground voltage is provided to the first node, and the power supply voltage is provided to the second node during the first time, and the ground voltage is provided to the second node during the second time.

19. The read-out circuit of claim 18, wherein the calibration control circuit adjusts capacitance of the offset capacitor according to an output of the operational amplifier after the second time.

* * * * *